United States Patent [19]

Kamada et al.

[11] 3,953,303

[45] Apr. 27, 1976

[54] PROCESS FOR THE MANUFACTURE OF MESH SCREEN FOR X-RAY PHOTOGRAPHY SENSITIZATION

[75] Inventors: Hatohiko Kamada; Koichi Tashiro, both of Minami-ashigara, Japan

[73] Assignee: Fuji Photo Film Co., Ltd., Minami-ashigara, Japan

[22] Filed: Feb. 6, 1974

[21] Appl. No.: 440,091

Related U.S. Application Data

[63] Continuation-in-part of Ser. No. 188,494, Aug. 12, 1971, abandoned.

[30] Foreign Application Priority Data

Oct. 12, 1970 Japan................................ 45-89559

[52] U.S. Cl.................................. 204/15; 96/116; 204/38 R
[51] Int. Cl.².......................... C25D 5/02; G03F 5/00
[58] Field of Search................ 204/11, 24, 15, 38 R; 250/486; 96/36, 116; 117/71

[56] References Cited
UNITED STATES PATENTS

| | | | |
|---|---|---|---|
| 2,443,119 | 6/1948 | Rubin | 204/18 |
| 3,192,136 | 6/1965 | Reid | 204/11 |
| 3,230,163 | 1/1966 | Dreyfus | 204/15 |
| 3,344,276 | 9/1967 | Balding | 250/486 |
| 3,575,824 | 4/1971 | Eide | 204/15 |
| 3,619,285 | 11/1971 | Feldstein | 117/212 |
| 3,657,075 | 4/1972 | Oshima | 204/15 |
| 3,717,764 | 2/1973 | Fujimura | 250/486 |

OTHER PUBLICATIONS

Plating, July, 1967 pp. 817–820.
Photo Methods for Industry, Vol. 12, No. 10, Oct. 1969, pp. 64, 66, 68.

*Primary Examiner*—T. M. Tufariello
*Attorney, Agent, or Firm*—Sughrue, Rothwell, Mion & Zinn

[57] ABSTRACT

A process for the manufacture of mesh screen for the sensitization of X-ray photography which comprises forming a heavy metal layer and a sensitive polymer layer on a support, to form a support having layers thereon, exposing said support through a negative original having mesh lines and developing, whereupon the heavy metal portions other than the mesh lines are exposed, and provided with a given thickness of a heavy metal layer.

5 Claims, No Drawings

PROCESS FOR THE MANUFACTURE OF MESH SCREEN FOR X-RAY PHOTOGRAPHY SENSITIZATION

This application is a continuation in part of Ser. No. 188,494 filed Oct. 12, 1971, now abandoned.

BACKGROUND OF THE INVENTION

1. Field of the Invention

This invention relates to a process for the manufacture of mesh screen for X-ray photography sensitization. More particularly, it relates to a process for the manufacture of mesh screen for X-ray photography sensitization having a heavy metal mesh.

2. Prior Art

In general, medical X-ray photographs are prepared by applying fluorescent sensitization screens to both surfaces of the photographic sensitive material coated with an emulsion on both surfaces of the support and directing X-rays thereto through an object to be photographed.

It is well known that the fluorescent sensitization screen affects greatly the sharpness of the image formed on a photographic sensitive material. The higher the sensitization rate of the fluorescent sensitization screen, the more strongly appears this phenomenon. Moreover, the effect of scatter rays adversely affects the sharpness of the image. On the other hand, it has long been a goal in this field to prepare an image of excellent sharpness with X-rays while using as little radiation as possible because X-rays are injurious to the human body.

This problem has been largely solved by the invention disclosed in U.S. patent application Ser. No. 16,756 now U.S. Pat. No. 3,717,764. That is, the invention described therein relates to a fluorescent screen in which a fluorescent material is filled between parallel or concentric heavy metal walls and the various processes for the manufacture of the screen.

OBJECTS OF THE INVENTION

An object of this invention is to provide a process for manufacturing simply and cheaply a mesh screen for the fluorescent sensitization.

Another object of this invention is to manufacture mesh screen for fluorescent sensitization suitable for the accurate formation of images having excellent sharpness.

BRIEF SUMMARY OF THE INVENTION

The objects of this invention are accomplished by providing a heavy metal layer on the surface of a synthetic resin film, thin plate, or paper and photoetching the same.

The heavy metal layer may be formed on a support by electroless plating, electroplating, or lamination with an adhesive. Preferably, the thickness of the resulting heavy metal layer is more than 20 $\mu$.

DETAILED DESCRIPTION OF THE INVENTION

As synthetic resins to be used in the form of a film or thin plate, there are typically polyethylene terephthalate, polypropylene, polyvinyl chloride, polycarbonate, polyethylene tetrafluoride, polyacrylic acid, cellulose acetate and the like. Of course, the thickness of resin is not critical. An undercoat layer may be formed by, for example, the undercoating method according to U.S. patent application Ser. No. 753,896 now U.S. Pat. No. 3,628,990 or an adhesive layer of epoxy or polyolefin series and others on the support of synthetic resin or paper and the heavy metal layer may be formed thereon.

The heavy metal useful herein is typically copper, lead, bismuth, thorium, silver, etc., preferably those having an atomic weight of more than 63.

The electroless plating may be carried out, for example, by the process in which a metallic copper is separated with an aqueous electroless copper solution of alkali-formalin series after the etching treatment with an aqueous mixed solution of chromic anhydride and sulfuric acid, the sensitizing treatment with an aqueous acid solution of stannic chloride and the activating treatment with an aqueous acid solution of palladium chloride.

The electroplating may be carried out, for example, by the process in which a metallic lead is plated heavily by the electroplating method onto the surface, which is provided with an electroconductivity by means of separated metal by electroless plating, in an electroplating bath, in which additives are added, of an aqueous borofluoric acid solution of lead borofluoride.

To provide a mesh to the heavy metal layer which has been formed as mentioned above, it is sufficient to coat said heavy metal surface with a solution of a light-sensitive polymer, e.g., a polymer consisting mainly of vinyl cinnamate such as KPR (manufactured by Eastman Kodak Co., Ltd.), TPR (manufactured by Tokyo Ooka Kogyo Co., Ltd.) etc., in a thickness of 3 to 50 microns, preferably 5 to 50 microns, expose the object to be photographed through the mesh, remove the sensitive polymer at the unexposed area to expose the heavy metal (preferably lead) layer at the area and etch with an etching solution.

In another embodiment of this invention, it is possible to form a thin metal layer on said support by electroplating to provide electroconductivity, coat a sensitive polymer layer thereon and dry, expose, develop, plate electrolytically, further expose the metal surface with a heavy metal to make the mesh screen of the heavy metal thicker, remove the sensitive polymer layer and finally etch the exposed thin metal layer.

The heavy metal mesh screen which is obtained in the manner as mentioned above, should have more than 80 lines per inch, preferably 100–200 lines per inch, and a width of less than 10 microns for its use, and a thickness of 20 to 50 microns.

For its use, the mesh screen is coated with a fluorescent material so that the material may be present in the crevices of the mesh heavy metal surface, or is combined with a fluorescent sensitizing base. Such fluorescent sensitization mesh screen can provide an image of excellent sharpness by the X-ray photograph as described in U.S. patent application Ser. No. 16,756.

According to the process of this invention, an accurate mesh screen can be manufactured by a simple and rapid procedure because the mesh screen is formed by a photographic process.

A variety of embodiments according to this invention will be illustrated by the following examples.

EXAMPLE 1

A polyethylene terephthalate film of 180 $\mu$ thickness was provided with the undercoat, on which a solution having the following composition was coated onto the film as a first layer, followed by drying.

| First layer: | | |
|---|---|---|
| Polycondensation product of ethylene glycolisophthalic acid-triethylene glycol | 0.3 | parts |
| Ethylene chloride | 62 | parts |
| Acetone | 18 | parts |
| Nitrocellulose | 0.2 | parts |
| Tetrachloroethane | 9.7 | parts |
| Phenol | 9.8 | parts |

An organic solvent dispersion having the following composition was coated onto the film as a second layer and dried.

| Second layer: | | |
|---|---|---|
| Gelatin | 1 | part |
| Water | 2 | parts |
| Methyl alcohol | 20.7 | parts |
| Methyl glycol | 16.0 | parts |
| Ethylene chloride | 50 | parts |
| Salicyclic acid | 1.3 | parts |
| Acetone | 10 | parts |

After the foregoing solutions were coated onto the surface of the polyethylene terephthalate film and dried, the material was subjected to electroless copper plating in the conventional manner and then to electrolytic copper plating to form a copper layer of 3–5 µ thick. The surface was coated with a resist of light sensitive vinyl cinnamate of 5 µ thickness, dried, irradiated with ultraviolet rays (350–450 m µ) through a negative film having a mesh of 150 lines/inch and 175 lines/inch respectively, and developed with trichlene. The resist of vinyl cinnamate at the unexposed area was removed to expose the surface of copper. The exposed surface of copper was etched at 50°C. ± 5°C., for 5–10 min., with an etching liquid having the following composition:

| Composition of Etching Liquid: | |
|---|---|
| Ferric chloride (more than 40 Be) | 37 wt.% |
| Water | 63 wt.% |

Both components were mixed and added with 0.1 g/l liter fluorinated hydrocarbon surface active agents to prevent the side etching. Then the resist of vinyl cinnamate at the exposed area was removed to expose the surface of copper mesh line. The size of mesh line etched was less than 7 µ. The mesh was subjected to the electrolytic lead plating with a liquid having the following composition:

| Composition of Electroplating: | |
|---|---|
| Lead borofluoride | 20 wt.% |
| Water | 99.9 – 99.5 wt.% |
| Glue or Gelatin | 0.1 – 0.5 wt.% |
| pH | 0.5 – 2.0 |
| Temperature (°C) | 30 – 40 |
| Current density (20µ thick) | 3 A/dem² |

Thus, a heavy metal mesh screen having a size of 10 µ was obtained. The final product is electroplated lead on the exposed portion of the light sensitive polymer, since the unexposed portion of the light-sensitive polymer has been removed.

EXAMPLE 2

A metallic lead foil of 30 µ thickness was laminated onto a cellulose triacetate film of 200 µ thickness by means of an adhesive (epoxy or acrylic acid ester series are useful), coated further with 5 µ layer of light-sensitive polymer of vinyl cinnamate series and following exposure, development and exposed polymer removal, was treated with an etching liquid having the same composition as in Example 1 to form a lead mesh screen having a size of 6 µ, the lead being over the unexposed portion of the film, after removal of unexposed light sensitive polymer.

EXAMPLE 3

A polypropylene or teflon film of 100 µ thickness was treated by corona discharge of ultraviolet radiation, provided with an undercoat, on which a solution having the following composition was coated onto the film as a first layer, following by drying.

| First layer: | | |
|---|---|---|
| Polycondensation product of ethylene glycol-isophthalic acid-triethylene glycol | 0.3 | parts |
| Ethylene chloride | 62 | parts |
| Acetone | 18 | parts |
| Nitrocellulose | 0.2 | parts |
| Tetrachloroethane | 9.7 | parts |
| Phenol | 9.8 | parts |

An organic solvent dispersion having the following composition was coated onto the film as a second layer and dried.

| Second layer: | | |
|---|---|---|
| Gelatin | 1 | part |
| Water | 2 | parts |
| Methyl alcohol | 20.7 | parts |
| Methyl glycol | 16.0 | parts |
| Ethylene chloride | 50 | parts |
| Salicylic acid | 0.3 | parts |
| Acetone | 10 | parts |

After the foregoing solutions were coated onto the surface of the film and dried, it was subjected to the elctroless and electrolytic copper plating in a common manner up to 5 µ, coated further with a light-sensitive polymer and exposed and etched in the same manner as in Example 1. Thereafter, a lead layer of 25–30 µ was formed by the electrolytic lead plating. The size of the resulting mesh line was 8 µ. The final product is similar to the product of Example 1.

EXAMPLE 4

A polyethylene terephthalate film of 180 µ thick was subjected to the electroless copper plating in a common manner and then to the electrolytic copper plating to form a 5 µ copper layer (coated onto the copper layer was a light-sensitive polymer up to more than 20 µ thick). Then, the film was irradiated with ultraviolet rays through a positive film having mesh of 150 lines/inch and developed to remove unexposed light-sensitive polymer to expose the copper layer portions corresponding to the half-tone screen of said positive film. The copper layer was subjected further to the electrolytic lead plating to form a lead layer of 50 µ thickness. The exposed sensitive polymer was successively removed and the thus exposed copper layer was etched at 40°–50°C., with 25% ammonium persulfate solution, whereupon the lead lines on the copper layer remained to yield a mesh screen.

EXAMPLE 5

To increase further the brightness, the mesh screens formed in Examples 1–4 were coated with evaporated aluminum. The thickness thereof was 250 – 300 A.

EXAMPLE 6

A polyethylene terephthalate film (150–200 $\mu$ thick) was subjected to the electroless silver plating (up to more than 0.4 $\mu$ thick) to form a silver mirror. The surface of the silver mirror was coated with a light sensitive polymer, printed with a positive having a mesh of 175 lines/inch, (an image was formed so as to expose the silver mirror corresponding to mesh lines), and the unexposed polymer was removed and the resulting mesh line area was subjected to the electrolytic lead plating (up to 30–50 $\mu$ thickness) and the polymer on the surface of silver mirror corresponding to the exposed area was removed, whereupon a mesh screen was obtained, in which a lead mesh was formed on the surface of the silver mirror corresponding to the unexposed portion of the film.

EXAMPLE 7

A polyethylene terephthalate film (150–200 $\mu$ thick) was provided with an undercoat, on which a solution having the following composition was coated onto the film as a first layer, followed by drying.

First layer:
| Polycondensation production of ethylene glycolisophthalic acid-triethylene glycol | 0.3 | parts |
|---|---|---|
| Ethylene chloride | 62 | parts |
| Acetone | 18 | parts |
| Nitrocellulose | 0.2 | parts |
| Tetrachloroethane | 9.7 | parts |
| Phenol | 9.8 | parts |

An organic solvent dispersion having the following composition was coated onto the film as a second layer and dried.

Second layer:
| Gelatin | 1 | part |
|---|---|---|
| Water | 2 | parts |
| Methyl alcohol | 20.7 | parts |
| Methylglycol | 16.0 | parts |
| Ethylene chloride | 50 | parts |
| Salicylic acid | 0.3 | parts |
| Acetone | 10 | parts |

After the foregoing solution was coated onto the surface of the polyethylene terephthalate film and dried, the film was subjected in the conventional manner to a chemical etching sensitizing and activating treatment. A sensitive polymer was coated thereon, exposed through a positive film having a mesh of 150 lines/inch and developed, whereupon the exposed mesh line area corresponded to the portion subjected to the pretreatment. The film was then subjected to electroless copper plating to yield a mesh line area provided with an electroconductivity. A lead layer 50 $\mu$ thick was formed by the electrolytic lead plating and the sensitive polymer was removed resulting in a metallic lead mesh screen.

The term "exposed" and the like as used herein in relationship to "exposure" to a positive or negative film is used in the conventional photographic sense. The term exposed and the like as used herein in relationship to removal of a coating or layer from the support is used to mean that the surface beneath the removed coating or layer (generally only a portion of the coating or layer) becomes visible. It is believed this terminology is apparent from the detailed description of the invention herein.

What is claimed is:

1. In a process of making a medical X-ray photograph by applying fluorescent sensitization screens having more than 80 lines per inch of a heavy metal having an atomic weight of more than 63 and a width of 10 microns or less, said screen having a thickness of 20 to 50 microns, to both surfaces of photographic sensitive material coated with an emulsion on both surfaces of the support therefore and directing X-rays thereto through an object, the improvement in which said screen is produced by the process comprising
   a. forming a layer of a heavy metal on the surface of a support,
   b. applying a layer of a light sensitive polymer consisting mainly of vinyl cinnamate over said layer of a heavy metal,
   c. exposing said layer of a light sensitive polymer through a positive original having a mesh or strip screen of more than 80 lines per inch thereon,
   d. removing the unexposed portions of said layer of a light sensitive polymer whereby the portions of said layer of a heavy metal corresponding to the unexposed portions of said layer of a light sensitive polymer is exposed,
   e. electroplating a layer of a heavy metal over said portions of said heavy metal layer, and then fluorescent sensitizing said screen without removing said exposed layer of light sensitive polymer.

2. The screen produced by the process of claim 1.

3. The process of claim 1 wherein the electroplated layer comprises lead or a lead salt.

4. The process of claim 1 wherein the support is a plastic film.

5. In a process of making a medical X-ray photograph by applying fluorescent sensitization screens having more than 80 lines per inch of a heavy metal having an atomic weight of more than 63 and a width of 10 microns or less, said screen haivng a thickness of 20 to 50 microns, to both surfaces of photographic sensitive material coated with an emulsion on both surfaces of the support therefore and directing X-rays thereto through an object, the improvement in which said screen is produced by the process comprising
   a. applying to a support a coating composition comprising a polycondensation product of ethylene glycolisophthalic acid-triethylene glycol as a first layer followed by the application of a second coating composition comprising gelatin,
   b. chemically etching said support to sensitize and activate said support,
   c. applying a layer of a light sensitive polymer consisting mainly of vinyl cinnamate to said chemically etched support,
   d. exposing said layer of a light sensitive polymer through a positive original having a mesh or strip screen of more than 80 lines per inch thereon,
   e. removing the unexposed portions of said layer of a light sensitive polymer,
   f. electroless plating a layer of a heavy metal over said support to produce a mesh line area characterized by electroconductivity, g. electrolytically applying a layer of a heavy metal over said electroless plated layer
h. removing said exposed light sensitive polymer, and then fluorescent sensitizing said screen.

* * * * *